(12) United States Patent
Mieczkowski et al.

(10) Patent No.: US 8,896,122 B2
(45) Date of Patent: Nov. 25, 2014

(54) SEMICONDUCTOR DEVICES HAVING GATES INCLUDING OXIDIZED NICKEL

(75) Inventors: Van Mieczkowski, Apex, NC (US); Helmut Hagleitner, Zebulon, NC (US); Kevin Haberern, Cary, NC (US)

(73) Assignee: Cree, Inc., Durham, NC (US)

( * ) Notice: Subject to any disclaimer, the term of this patent is extended or adjusted under 35 U.S.C. 154(b) by 423 days.

(21) Appl. No.: 12/778,334

(22) Filed: May 12, 2010

(65) Prior Publication Data

US 2011/0278590 A1   Nov. 17, 2011

(51) Int. Cl.
| | |
|---|---|
| H01L 21/335 | (2006.01) |
| H01L 29/778 | (2006.01) |
| H01L 29/24 | (2006.01) |
| H01L 29/80 | (2006.01) |
| H01L 29/66 | (2006.01) |
| H01L 29/47 | (2006.01) |
| H01L 29/812 | (2006.01) |
| H01L 29/872 | (2006.01) |
| H01L 29/16 | (2006.01) |
| H01L 29/20 | (2006.01) |

(52) U.S. Cl.
CPC .......... *H01L 29/66068* (2013.01); *H01L 29/47* (2013.01); *H01L 29/475* (2013.01); *H01L 29/66871* (2013.01); *H01L 29/7786* (2013.01); *H01L 29/812* (2013.01); *H01L 29/872* (2013.01); *H01L 29/1608* (2013.01); *H01L 29/2003* (2013.01)
USPC .............. 257/766; 257/76; 257/77; 257/205; 257/280

(58) Field of Classification Search
USPC .............................. 257/280, 205, 76, 77, 766
See application file for complete search history.

(56) References Cited

U.S. PATENT DOCUMENTS

| | | | | |
|---|---|---|---|---|
| 3,872,359 | A * | 3/1975 | Feuersanger | ................... 257/43 |
| 6,153,271 | A | 11/2000 | Mearini | |
| 6,618,409 | B1 | 9/2003 | Hu et al. | |
| 2005/0151255 | A1 | 7/2005 | Ando et al. | |
| 2009/0057720 | A1 | 3/2009 | Kaneko | |
| 2010/0038705 | A1 | 2/2010 | Doris et al. | |
| 2010/0090225 | A1 | 4/2010 | Sato | |
| 2010/0155720 | A1* | 6/2010 | Kaneko | ........................... 257/43 |

FOREIGN PATENT DOCUMENTS

| | | |
|---|---|---|
| EP | 2 071 623 A2 | 6/2009 |
| JP | 02-197560 | 8/1990 |
| JP | 04-373175 | 12/1992 |
| JP | 2004-022773 | 1/2004 |
| JP | 2006-196764 | 7/2006 |
| JP | 2009-076846 | 4/2009 |
| WO | WO 2008/035403 A1 | 3/2008 |

OTHER PUBLICATIONS

International Search Report Corresponding to International Application No. PCT/US2011/034894; Date of Mailing: Jul. 29, 2011; 10 pages. Kikkawa et al., "High performance and high reliability AlGaN/GaN HEMTs," Phys. Status Solidi A, 206, No. 6, pp. 1135-1144.

(Continued)

*Primary Examiner* — Matthew W Such
*Assistant Examiner* — Robert Carpenter
(74) *Attorney, Agent, or Firm* — Myers Bigel Sibley & Sajovec (57) ABSTRACT

Schottky barrier semiconductor devices are provided including a wide bandgap semiconductor layer and a gate on the wide bandgap semiconductor layer. The gate includes a metal layer on the wide bandgap semiconductor layer including a nickel oxide (NiO) layer. Related methods of fabricating devices are also provided herein.

14 Claims, 4 Drawing Sheets

(56) References Cited

OTHER PUBLICATIONS

Notification Concerning Transmittal of International Preliminary Report on Patentability; International Application No. PCT/US2011/034894; Date of Issuance: Nov. 23, 2012; 8 pages.

Office Action, Japanese Patent Application No. 2013-510130, Mar. 26, 2014.

Extended European Search Report, EP 11781034.1, Aug. 6, 2014, 7 pages.

* cited by examiner

SEMICONDUCTOR DEVICES HAVING GATES INCLUDING OXIDIZED NICKEL

FIELD

This invention relates to semiconductor devices and, more particularly, to Schottky barrier devices and related methods.

BACKGROUND

Schottky barrier devices are widely used in many consumer, commercial and other applications. A Schottky barrier is a potential barrier formed at a metal-semiconductor junction, which has rectifying characteristics. Many Schottky barrier devices use wide bandgap semiconductors, such as silicon carbide, gallium nitride and/or gallium arsenide, which may be used for high power, high temperature and/or microwave applications. Semiconductor Schottky barrier devices include Schottky diodes, High Electron Mobility Transistors (HEMTs) and MEtal Semiconductor Field Effect Transistors (MESFETs). A HEMT is a field effect transistor that incorporates a junction between two materials with different bandgaps (i.e., a heterojunction) as the channel, instead of a doped region, as is generally the case in integrated circuit field effect transistors. A Schottky barrier gate is used to control a two-dimensional electron gas (2DEG) between a source region and a drain region. In a MESFET, a Schottky barrier gate is used to control conduction in a channel that is formed between source and drain regions.

Nickel is frequently used for Schottky gates for gallium arsenide (GaN) HEMTs, for example, evaporated Nickel-Platinum-Gold (NiPtAu). These Ni gates commonly degrade and become leaky when the device is reverse biased. These leakages then tend to increase several orders of magnitude when stress is applied during operation, thus causing reliability issues with the device. An attempt to address the leakage problems with nickel gates is discussed in *High Performance High Reliability AlGaN/GaN HEMTs* by Kikkawa et al. As discussed therein, a NiPtAu structure is provided with an NiO spacer layer on the sides of the gate.

SUMMARY

Some embodiments discussed herein provide Schottky barrier semiconductor devices including a wide bandgap semiconductor layer and a gate on the wide bandgap semiconductor layer. The gate includes a metal layer on the wide bandgap semiconductor layer including a nickel oxide (NiO) layer.

In further embodiments, the gate may further include a diffusion barrier layer on the NiO metal layer; and current spreading layer on the diffusion barrier layer.

In still further embodiments, the wide bandgap semiconductor layer may include gallium nitride (GaN), the diffusion barrier layer may include platinum (Pt) and the current spreading layer may include gold (Au).

In some embodiments, the Pt diffusion barrier layer may have a thickness of from about 100 to about 200 Å and the Au current spreading layer may have a thickness of from about 3000 Å to about 1.0 µm.

In further embodiments, the NiO layer may be directly on the GaN layer. The Pt diffusion layer may be directly on the NiO layer and the Au current spreading layer may be directly on the Pt diffusion layer.

In still further embodiments, the NiO layer may have a thickness of from about 50 to about 300 Å.

In some embodiments, the device may further include a layer of nickel between the wide bandgap semiconductor layer and the NiO layer or a layer of nickel on the NiO layer. The NiO layer may have a thickness of from about 50 to about 300 Å and the layer of nickel may have a thickness of about 300 Å.

In further embodiments, the diffusion barrier layer may be a multilayer diffusion barrier layer and the multilayer diffusion barrier layer may include at least two layers including platinum, molybdenum, tungsten, chromium, and/or tantalum.

In still further embodiments, the wide bandgap semiconductor layer may include gallium nitride (GaN) and/or silicon carbide (SiC), the current spreading layer may include gold and/or copper, and the diffusion barrier layer may include a multilayer diffusion barrier layer including at least two layers including platinum, molybdenum, tungsten, chromium, and/or tantalum.

In some embodiments, the device may further include source and drain regions, a respective one of which is adjacent an opposing end of the metal layer and configured to provide a high electron mobility transistor (HEMT) or a metal semiconductor field effect transistor (MESFET).

Further embodiments provide Schottky barrier semiconductor devices including a first layer comprising gallium nitride; a second layer comprising nickel oxide on the first layer; a third layer comprising tantalum on the second layer, remote from the first layer; and a fourth layer comprising platinum on the third layer, remote from the second layer.

In still further embodiments, the second layer may be directly on the first layer, the third layer may be directly on the second layer and the fourth layer may be directly on the third layer.

In some embodiments, the device may further include source and drain regions, a respective one of which is adjacent an opposing end of the second layer and configured to provide a high electron mobility transistor (HEMT) or a metal semiconductor field effect transistor (MESFET).

In further embodiments, the device may further include a fifth layer of nickel between the first and second layers.

In still further embodiments, the device may further include a fifth layer of nickel between the second and third layers.

Some embodiments provide methods of forming a Schottky barrier semiconductor device including providing a wide bandgap semiconductor layer; and forming a gate on the wide bandgap semiconductor layer, wherein forming the gate comprises forming an oxidized nickel (NiO) layer on the wide bandgap layer.

In further embodiments, forming the NiO layer may include evaporating nickel on portions of the wide band gap layer; and simultaneously exposing the nickel to less than about 10 sccm of oxygen during evaporation to provide the NiO layer. Evaporating may include thermal evaporation or e-beam evaporation.

In still further embodiments, forming the NiO layer may include depositing nickel using a sputtering process and introducing oxygen during the sputtering process to provide the NiO layer.

In some embodiments, forming the NiO layer may include introducing oxygen in situ during formation of a nickel layer to provide the NiO layer.

In further embodiments, less than about 10 sccm of oxygen may be generated using a plasma source. The plasma source may be a gridless end-Hall plasma source.

In still further embodiments, providing the wide bandgap semiconductor layer may include providing a gallium nitride (GaN) layer. Forming the gate may further include forming a platinum (Pt) diffusion barrier layer on the NiO metal layer; and forming a gold (Au) current spreading layer on the diffusion barrier layer. The NiO layer may be formed directly on the GaN layer.

In some embodiments, a layer of nickel may be formed between the wide bandgap semiconductor layer and the NiO layer or on the NiO layer.

In further embodiments, the method may further include forming source and drain regions, a respective one of which is adjacent an opposing end of the NiO layer and configured to provide a high electron mobility transistor (HEMT) or a metal semiconductor field effect transistor (MESFET).

DETAILED DESCRIPTION

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises", "comprising", "includes" and/or "including" (and variants thereof), when used in this specification, specify the presence of stated features, steps, operations, elements, and/or components, but do not preclude the presence or addition of one or more other features, steps, operations, elements, components, and/or groups thereof. For example, when a layer is indicated as "comprising" a given material, the layer may include additional materials to form binary, ternary, quaternary etc., compounds, alloys, doped layers, etc. Thus, for example, a layer that comprises gallium nitride includes a layer of aluminum gallium nitride, indium gallium nitride and/or aluminum indium gallium nitride. In contrast, the term "consisting of" (and variants thereof) when used in this specification, specifies the stated features, steps, operations, elements, and/or components, and precludes additional features, steps, operations, elements and/or components. Finally, all of the above defined terms do not preclude the layer from being doped P-type and/or N-type using, for example, P-type dopants such as magnesium and/or N-type dopants such as silicon.

It will be understood that when an element such as a layer, region or substrate is referred to as being "on" another element (and variants thereof), it can be directly on the other element or intervening elements may also be present. Furthermore, relative terms such as "beneath", "overlies", "topside" and "backside" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention may be particularly well suited for use in nitride-based HEMTs, such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

It will be understood that although embodiments of the present invention are described in connection with GaN HEMT devices, the present invention may be used in connection with other types of devices and/or materials without departing from the scope of the present application. For example, embodiments of the invention may also be used in other Schottky devices.

Nickel is the most commonly used metal for Schottky gates on GaN HEMTs, for example, NiPtAu gates. These nickel gates may degrade and become leaky in reverse bias. Such leakages may increase several orders of magnitude when stress is applied during operation of the device. Embodiments of the present invention arise from the realization that reverse bias leakage on NiPtAu gates commonly used in the GaN HEMT industry may be caused by the formation of nickel silicides on edges adjacent to the gate. The work function of nickel silicide is lower than that of nickel and, therefore, may lead to leaky gates in reverse bias. This problem may be multiplied by high temperatures, for example, temperatures greater than about 300° C., and may cause reliability issues. Accordingly, some embodiments of the present invention provide an NiO layer or Ni/NiO layer on the semiconductor layer to suppress formation of nickel silicide as will be discussed further herein with respect to FIGS. 1 through 6C.

Various embodiments of semiconductor Schottky barrier devices will be described herein. As used herein, the term "semiconductor Schottky barrier device" may include a Schottky diode, HEMT, MESFET and/or other semiconductor Schottky barrier device that includes one or more semiconductor layers, which may include silicon, silicon carbide, gallium nitride and/or other semiconductor materials. A semiconductor Schottky barrier device may or may not include a substrate such as a sapphire, silicon, silicon carbide, aluminum nitride and/or other microelectronic substrate(s).

Figure 1:
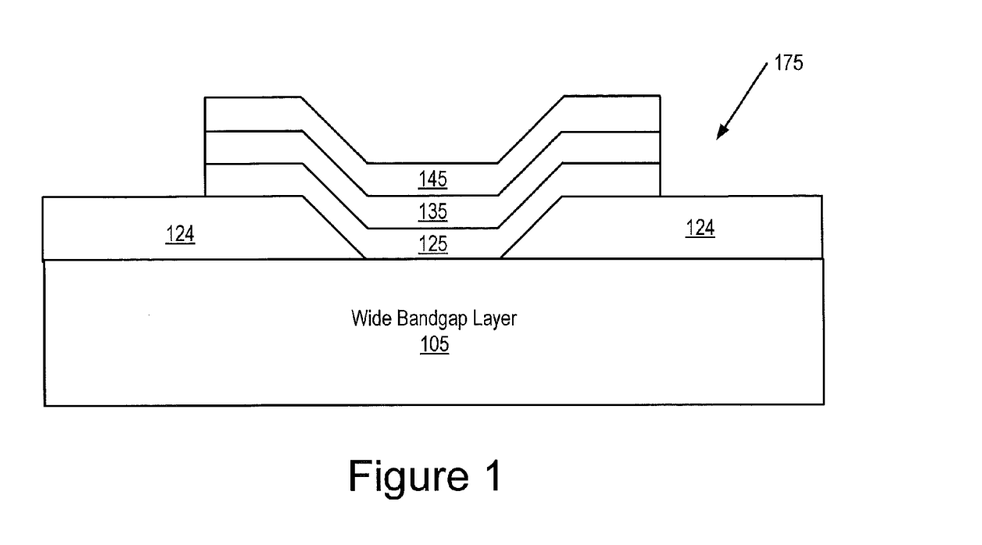
FIGS. 1 through 4 are a cross-sections of devices having gates including nickel oxide (NiO) layers according to various embodiments described herein.

Referring now to FIG. 1, a simplified cross-section illustrating a wide bandgap Schottky barrier device including a nickel oxide (NiO) layer in the gate structure will be discussed. The wide bandgap Schottky barrier device may be, for example, a Schottky diode, a HEMT and a MESFET according to various embodiments described herein.

Referring now to FIG. 1, a semiconductor Schottky barrier device includes a wide bandgap semiconductor layer 105 that may include, for example, material(s) having a bandgap of at least about 1.7 eV, such as silicon carbide (SiC) and/or gallium nitride (GaN). The wide bandgap semiconductor layer 105 may be freestanding, may include a portion of a substrate or may itself be on a substrate. Various buffer layers and/or other layers may also be provided as will be discussed further below.

As further illustrated in FIG. 1, a gate structure 175 is provided on a dielectric layer 124. The dielectric layer 124 may include silicon nitride ($Si_xN_y$), silicon dioxide ($SiO_2$), AlSiN, aluminum nitride (AlN) and/or another suitable dielectric material, such as silicon oxynitride (SiON). It will be understood that the terms "$Si_xN_y$," "SiN" and "silicon nitride" are used herein interchangeably to refer to both stoichiometric and non-stoichimetric silicon nitride. Other materials may also be utilized for the dielectric layer 124. For example, the dielectric layer 124 could also include magnesium oxide, scandium oxide, aluminum oxide and/or aluminum oxynitride. Furthermore, the dielectric layer 124 may be a single layer or may include multiple layers of uniform and/or non-uniform composition. The material of the dielectric layer 124 should be capable of withstanding relatively high temperatures, and should be capable of being removed without significantly damaging the underlying layers.

In general, the dielectric layer 124 may be a dielectric layer that has a relatively high breakdown field strength and that provides a relatively low interface trap density at the interface with an underlying Group III-nitride layer. The dielectric layer 124 may have a high etch selectivity with respect to the material of the underlying layers, and may not be reactive to the material of the underlying layers. Moreover, the dielectric layer 124 may have a relatively low level of impurities therein. For example, the dielectric layer 124 may have a relatively low level of hydrogen and other impurities, including oxygen, carbon, fluorine and chlorine. In addition, the dielectric layer 124 may be stable at relatively high temperatures (e.g. >1000° C.) in order to withstand high annealing temperatures used in subsequent process steps.

Figure 4:
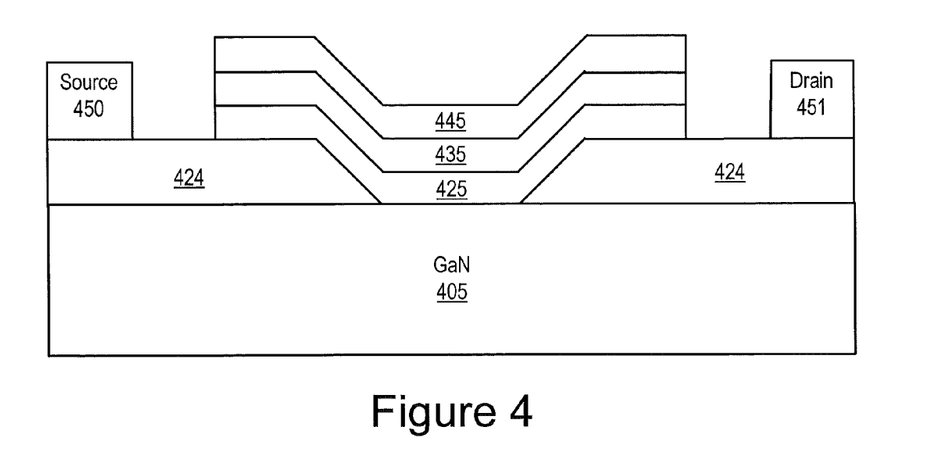

Referring again to FIG. 1, the gate structure 175 includes an NiO metal layer 125, a diffusion barrier layer 135 and a current spreading layer 145. In some embodiments, the wide bandgap semiconductor layer 105 may include gallium nitride (GaN) 405 as illustrated in FIG. 4, the diffusion barrier layer 135 may include platinum (Pt) and the current spreading layer 145 may include gold (Au). The NiO layer 125 may have a thickness of from about 50 to about 300 Å. In some embodiments, the NiO layer 125 may include from about 1.0 to about 50 percent oxygen. In further embodiments, the percent oxygen in the NiO layer may be in excess of 50%. As discussed above, the presence of the NiO layer 125 between the wide bandgap layer 105 and the diffusion barrier layer 135 may suppress formation of nickel silicide that may be present in conventional devices, thereby increasing the overall reliability of the device.

As discussed above, the presence of the NiO layer 125 between the wide bandgap layer 105 and the diffusion barrier layer 135 may suppress formation of nickel silicide that may be present in conventional devices, thereby increasing the overall reliability of the device.

The Pt diffusion barrier layer 135 may have a thickness of from about 100 to about 200 Å and the Au current spreading layer 145 may have a thickness of from about 3000 Å to about 1.0 µm. In some embodiments, the NiO layer 125 is provided directly on the wide bandgap layer, for example, a GaN layer. Similarly, in these embodiments, the Pt diffusion layer 135 may be directly on the NiO layer and the Au current spreading layer may be directly on the Pt diffusion layer.

Figure 2:
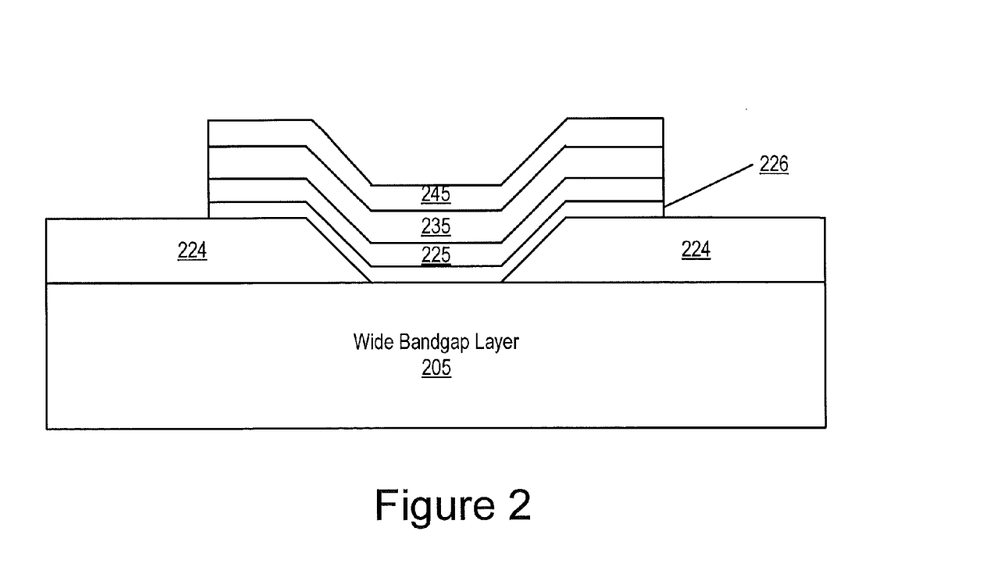

Referring now to FIG. 2, a cross-section of a device in accordance with some embodiments discussed herein will be discussed. Like elements refer to like elements throughout, accordingly details with respect the wide bandgap layer 205, 305, the metal layer 225, 325, the diffusion barrier layer 235, 335 and the current spreading layer 245, 345 will not be repeated in the interest of brevity. In some embodiments, a layer of nickel 226 may be provided between the wide bandgap semiconductor layer 205 and the NiO layer 225. As further illustrated in FIG. 3, the nickel layer 326 may also be provided on the NiO layer 325 between the NiO layer 325 and the diffusion barrier layer 335. In these embodiments, the layer of nickel 226, 326 may have a thickness of about 300 Å. As discussed above, the presence of the NiO/Ni or Ni/NiO layers between the wide bandgap layer and the diffusion barrier layer may suppress formation of nickel silicide that may be present in conventional devices.

Figure 3:
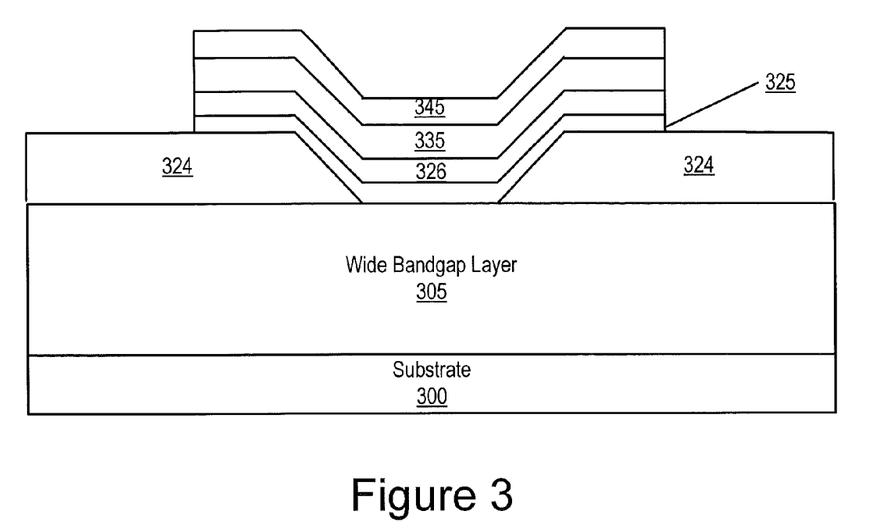

Referring now to FIGS. 1, 2 and 3, in some embodiments, the diffusion barrier layer may be a multilayer diffusion barrier layer. In these embodiments, the multilayer diffusion barrier layer may include at least two layers including platinum, molybdenum, tungsten, chromium, and/or tantalum. Multilayer diffusion barrier layers are discussed in detail in commonly assigned U.S. patent application Ser. No. 12/725,812, filed on Mar. 17, 2010, the disclosure of which is hereby incorporated herein by reference as if set forth in its entirety.

As discussed above, the wide bandgap semiconductor layer may be, for example, gallium nitride (GaN) and/or silicon carbide (SiC). A substrate (300, FIG. 3) may or may not be included without departing from the scope of the present application. Although not illustrated in the figures, an ohmic contact for the wide bandgap semiconductor layer 105 also may be provided.

Referring now to FIG. 4, a cross-section of a device in accordance with some embodiments discussed herein will be discussed. Like elements refer to like elements throughout, accordingly details with respect the wide bandgap layer 405, the metal layer 425, the diffusion barrier layer 435 and the current spreading layer 445 will not be repeated in the interest of brevity. As illustrated in FIG. 4, in some embodiments source 450 and drain 451 regions are provided on the dielectric layer 424 on a GaN Layer 405. As illustrated, the source 450 and drain 451 regions may be provided adjacent opposing ends of the metal layer 425. Devices illustrated in FIG. 4 may be configured to provide, for example, a high electron mobility transistor (HEMT) or a metal semiconductor field effect transistor (MESFET). In particular, a HEMT will be discussed in more detail with respect to FIG. 5.

Figure 5:
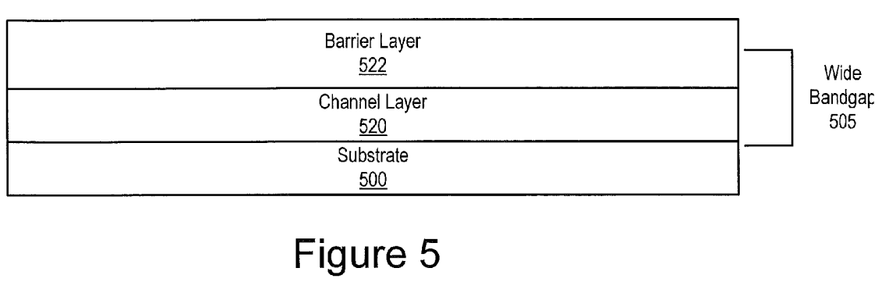
FIG. 5 is a cross section of a wide bandgap layer for use in high electron mobility transistor (HEMT) devices in accordance with some embodiments described herein.

Referring now to FIG. 5, a cross-section of a series of layers that may make up the wide bandgap layer 505 in HEMT device in accordance with some embodiments discussed herein. As illustrated in FIG. 5, a substrate 500 is provided. In particular embodiments of the present invention, the substrate 500 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 500. For example, an AlN buffer layer may be provided to provide an appropriate crystal structure transition between the silicon carbide substrate and the remainder of the device.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Referring again to FIG. 5, a channel layer 520 is formed on the substrate 500. The channel layer 520 may be formed on the substrate 500 using buffer layers, transition layers, and/or nucleation layers as described above. The channel layer 520 may be under compressive strain. Furthermore, the channel layer and/or buffer nucleation and/or transition layers may be epitaxially grown by metal-organic chemical vapor deposition (MOCVD) or by other techniques known to those of skill in the art, such as molecular beam epitaxy (MBE), hydride vapor phase epitaxy (HVPE) or other suitable techniques.

In some embodiments of the present invention, the channel layer 520 is a Group III-nitride, such as $Al_xGa_{1-x}N$ where $0 \le x<1$, provided that the energy of the conduction band edge of the channel layer 520 is less than the energy of the conduction band edge of the barrier layer 522 at the interface between the channel and barrier layers. In certain embodiments of the present invention, $x=0$, indicating that the channel layer 520 is GaN. The channel layer 520 may also include other Group III-nitrides such as InGaN, AlInGaN or the like. The channel layer 520 may be undoped ("unintentionally doped") and may be grown to a thickness of greater than about 20 Å. The channel layer 520 may also be a multi-layer structure, such as a superlattice or combinations of GaN, AlGaN or the like.

A barrier layer 522 is formed on the channel layer 520. The barrier layer 522 may have a bandgap that is greater than the bandgap of the channel layer 520 and the barrier layer 522 may also have a smaller electron affinity than the channel layer 520. The barrier layer 522 may be epitaxially grown directly on the channel layer 520. In certain embodiments of the present invention, the barrier layer 522 includes AlN, AlInN, AlGaN and/or AlInGaN with a thickness of between about 0.1 nm and about 10 nm. In some embodiments, the barrier layer may include $Al_xGa_{1-x}N$ where $0 \le x<0.32$. In particular embodiments, $x=0.22$.

While embodiments of the present invention are described herein with reference to particular HEMT structures, the present invention should not be construed as limited to such structures. For example, additional layers may be included in the HEMT device while still benefiting from the teachings of the present invention. Such additional layers may include a GaN cap layer on the barrier layer. Furthermore, the barrier layer 522 may also be provided with multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In particular embodiments of the present invention, the barrier layer 522 is thick enough and has a high enough Al composition and doping to induce a significant carrier concentration at the interface between the channel layer 520 and the barrier layer 522 through polarization effects when the barrier layer 522 is buried under ohmic contact metal. Also, the barrier layer 522 should be thick enough to reduce or minimize scattering of electrons in the channel due to ionized impurities deposited at the interface between the barrier layer 522 and a dielectric layer (124, 224, 324, 424).

As noted above, the barrier layer 522 may have a bandgap larger than that of the channel layer 520 and a smaller electron affinity than the channel layer 520. Accordingly, in certain embodiments of the present invention, the barrier layer 522 may include AlGaN, AlInGaN and/or AlN or combinations of layers thereof. The barrier layer 522 should not be so thick as to cause cracking or substantial defect formation therein. In certain embodiments of the present invention, the barrier layer 522 is undoped or doped with an n-type dopant to a concentration less than about $1 \times 10^{19}$ cm$^{-3}$. In some embodiments of the present invention, the barrier layer 522 includes $Al_xGa_{1-x}N$ where $0<x<=1$. In particular embodiments, the aluminum concentration may be about 25%. However, in other embodiments of the present invention, the barrier layer 522 comprises AlGaN with an aluminum concentration of between about 5% and about 100%. In some embodiments of the present invention, the aluminum concentration is greater than about 10%.

Figure 6A:
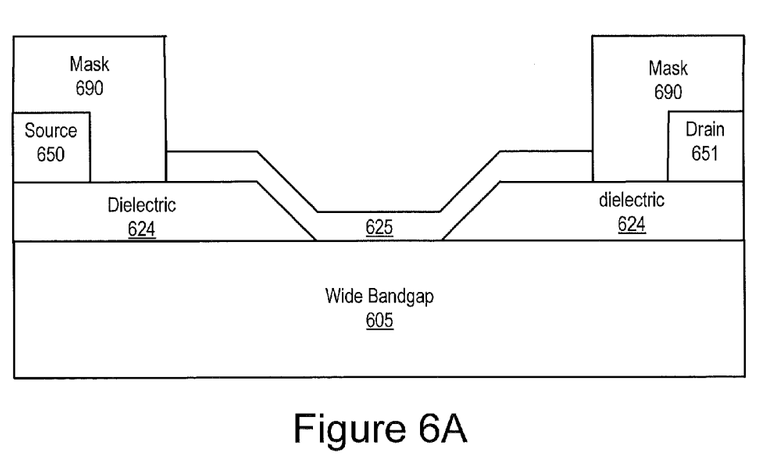
FIGS. 6A through 6C are cross-sections illustrating processing steps in the fabrication of NiO layers according to some embodiments described herein.
Figure 6B:
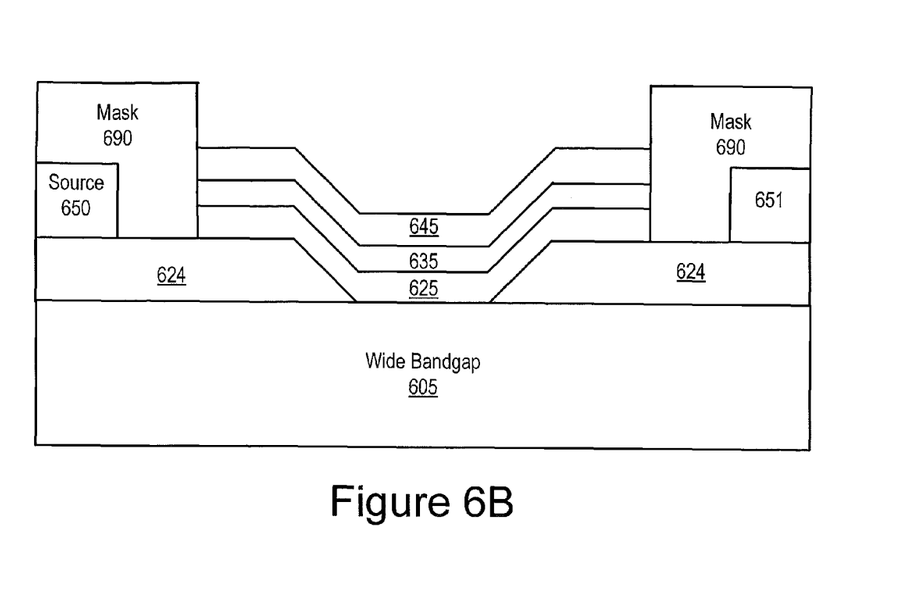
Figure 6C:
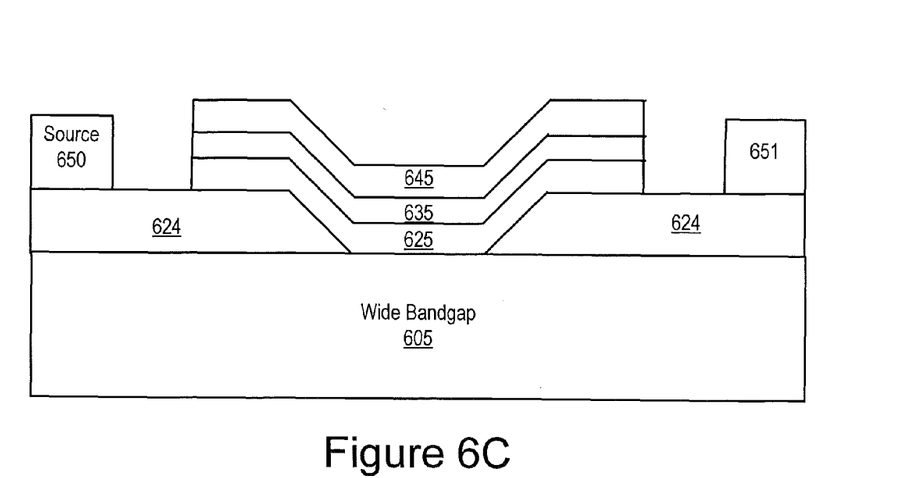

Referring now to FIGS. 6A through 6C, cross-sections illustrating processing steps in the fabrication of a gate including a NiO layer in accordance with some embodiments will be discussed. The fabrication of the GaN layer 605, the SiN layer 624, source 650, drain 651 and the portions of the device not illustrated in FIGS. 6A through 6C can be performed using methods known to those having skill in the art. Details discussed herein will be directed to the formation of the NiO and N/NiO layers in accordance with some embodiments of the present invention.

Referring first to FIG. 6A, a mask 690 is formed on the dielectric layer 624, the source 650 and the drain 651. As further illustrated in FIG. 6A, a nickel layer is formed on the exposed portion of the wide bandgap layer 605, for example, a GaN layer, according to the mask 690. In some embodiments, the nickel layer may be evaporated on portions of the GaN layer 605 exposed by the mask 690. During the evaporation process, the nickel may be exposed to less than about 10.0 sccm of oxygen to provide the NiO layer 625 in accordance with some embodiments of the present application. The evaporation may be performed using, for example, a thermal evaporation or an e-beam evaporation process without departing from the scope of the present application.

In some embodiments, the nickel layer may be deposited using a sputtering process. Oxygen may be introduced during the sputtering process to provide the NiO layer 625. In further embodiments, oxygen may be introduced in situ during formation of a nickel layer to provide the NiO layer 625. The less than about 10 sccm of oxygen may be generated using a plasma source, for example, a gridless end-Hall plasma source.

As illustrated in FIGS. 2 and 3 above, in some embodiments the formation of the NiO layer 625 may be preceded (226) or followed (326) by the formation of a nickel layer. Thus an Ni/NiO layer or NiO/Ni layer may be provided. This layer of Ni/NiO may provide the same advantages as the NiO layer discussed above.

Referring now to FIG. 6B, a diffusion barrier layer 635 of, for example, Pt, is formed on the NiO metal layer according to the mask 690. Then a current spreading layer 645 of, for example, Au, is formed on the diffusion barrier layer 635 according to the mask 690. In some embodiments, the diffusion barrier layer 635 is formed directly on the NiO layer 625 and the current spreading layer 645 is formed directly on the diffusion barrier layer 635. Other materials that can be used for the diffusion barrier layer 635 and the current spreading layer 645 are platinum, molybdenum, tungsten, chromium, and/or tantalum Referring now to FIG. 6C, the mask 690 is removed from the dielectric layer 624 and the source 650 and drain 651 regions. The device, for example, a high electron mobility transistor (HEMT) or a metal semiconductor field effect transistor (MESFET), may be completed using methods known to those having skill in the art.

As discussed above with respect to FIGS. 1 through 6C, some embodiments of the present invention provide an NiO layer or Ni/NiO layer on the wide bandgap layer to suppress formation of nickel silicide, which may provide more reliable devices.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A Schottky barrier semiconductor device comprising: a wide bandgap semiconductor layer; a gate on the wide bandgap semiconductor layer, the gate comprising a metal layer directly on the wide bandgap semiconductor layer, the metal layer including a nickel oxide (NiO) layer; and a layer of Nickel between the wide bandgap semiconductor layer and the NiO layer such that the wide bandgap layer does not contact the NiO layer.

2. The device of claim 1, wherein the gate further comprises:
   a diffusion barrier layer on the NiO metal layer; and
   a current spreading layer on the diffusion barrier layer.

3. The device of claim 2, wherein the diffusion barrier layer comprises a multilayer diffusion barrier layer and wherein the multilayer diffusion barrier layer comprises at least two layers including platinum, molybdenum, tungsten, chromium, and/or tantalum.

4. The device of claim 2, wherein the wide bandgap semiconductor layer comprises gallium nitride (GaN) and/or silicon carbide (SiC), wherein the current spreading layer comprises gold and/or copper, and wherein the diffusion barrier layer comprises a multilayer diffusion barrier layer and wherein the multilayer diffusion barrier layer comprises at least two layers including platinum, molybdenum, tungsten, chromium, and/or tantalum.

5. The device of claim 2, further comprising source and drain regions, a respective one of which is adjacent an opposing end of the metal layer and configured to provide a high electron mobility transistor (HEMT) or a metal semiconductor field effect transistor (MESFET).

6. The device of claim 2, wherein the wide bandgap semiconductor layer comprises gallium nitride (GaN), wherein the diffusion barrier layer comprises platinum (Pt) and wherein the current spreading layer comprises gold (Au).

7. The device of claim 6, wherein the Pt diffusion barrier layer has a thickness of from about 100 to about 200 Å and wherein the Au current spreading layer has a thickness of from about 3000 Å to about 1.0 μm.

8. The device of claim 6, wherein the NiO layer is directly on the layer of Nickel.

9. The device of claim 8, wherein the Pt diffusion layer is directly on the NiO layer and the Au current spreading layer is directly on the Pt diffusion layer.

10. The device of claim 1, wherein the NiO layer has a thickness of from about 50 to about 300 Å.

11. The device of claim 1, wherein the NiO layer has a thickness of from about 50 to about 300 Å and wherein the layer of Nickel has a thickness of about 300 Å.

12. A Schottky barrier semiconductor device comprising:
   a first layer comprising gallium nitride;
   a second layer comprising nickel oxide on the first layer;
   a third layer comprising tantalum on the second layer, remote from the first layer;
   a fourth layer comprising platinum on the third layer, remote from the second layer; and a layer of Nickel between the first and second layers such that the gallium nitride layer does not contact the nickel oxide layer.

13. The device of claim 12, wherein the second layer is directly on the layer of Nickel, the third layer is directly on the second layer and the fourth layer is directly on the third layer.

14. The device of claim 12, further comprising source and drain regions, a respective one of which is adjacent an opposing end of the second layer and configured to provide a high electron mobility transistor (HEMT) or a metal semiconductor field effect transistor (MESFET).

* * * * *

UNITED STATES PATENT AND TRADEMARK OFFICE
CERTIFICATE OF CORRECTION

PATENT NO. : 8,896,122 B2  
APPLICATION NO. : 12/778334  
DATED : November 25, 2014  
INVENTOR(S) : Mieczkowski et al.

It is certified that error appears in the above-identified patent and that said Letters Patent is hereby corrected as shown below:

<u>On the Title Page:</u> Column 2, item (56), under FOREIGN PATENT DOCUMENTS, line 6:

Please correct "JP    2009-076846    04/2009"  
to read -- JP    2009-076845    04/2009 --

Signed and Sealed this  
Seventh Day of April, 2015

Michelle K. Lee  
*Director of the United States Patent and Trademark Office*